United States Patent [19]
Kubota

[11] Patent Number: 5,365,877
[45] Date of Patent: Nov. 22, 1994

[54] METHOD OF GROWING SEMICONDUCTOR IN VAPOR PHASE

[75] Inventor: Hiroyasu Kubota, Tokyo, Japan

[73] Assignee: Kabushiki Kaisha Toshiba, Kawasaki, Japan

[21] Appl. No.: 92,587

[22] Filed: Jul. 16, 1993

Related U.S. Application Data

[63] Continuation of Ser. No. 672,555, Mar. 20, 1991, abandoned.

[30] Foreign Application Priority Data

Mar. 20, 1990 [JP] Japan ..................................... 2-70738

[51] Int. Cl.$^5$ ............................................ H01L 21/203
[52] U.S. Cl. ......................................... 117/93; 437/228; 437/243; 117/90; 117/97
[58] Field of Search ................ 156/610, 612, 613, 614, 156/643, 646; 437/228, 233, 234, 243; 427/255, 255.2; 118/725, 730; 117/89, 90, 93, 97

[56] References Cited

U.S. PATENT DOCUMENTS

| | | | |
|---|---|---|---|
| 4,510,177 | 4/1985 | Furumura et al. | 427/85 |
| 4,579,609 | 4/1986 | Reif et al. | 148/175 |
| 4,579,621 | 4/1986 | Hine | 156/612 |

OTHER PUBLICATIONS

Wolf et al., "Silicon Processing for the VLSI Era", Lattice Press, Sunset Beach, Calif., pp. 73–77 (1986).
Van Zant, "Microchip Fabrication", McGraw-Hill, New York, N.Y., pp. 308–309 (1986).
Wang et al., "Flow Visualization Studies for Optimization of OMVPE Reactor Design", Third International Conference on Metalorganic Vapor Phase Epitaxy, Aug. 1986.
Srinivasan, Journal of Crystal Growth 70 (1984) pp. 201–217.
Parker (ed.), The Technology and Physics of Molecular Beam Epitaxy, (1985) pp. 345–355.
Wolf et al., Silicon Processing for the VLSI Era, (1986) pp. 133–136, 142–147.

*Primary Examiner*—Olik Chaudhuri
*Assistant Examiner*—Ken Horton
*Attorney, Agent, or Firm*—Foley & Lardner

[57] ABSTRACT

A method of growing semiconductor in a vapor phase wherein a silicon oxide film on the surface of a semiconductor substrate wafer is removed, and a silicon layer is grown on the surface of the semiconductor substrate wafer in a vapor phase while rapidly rotating the wafer about a shaft substantially vertical to the wafer.

17 Claims, 4 Drawing Sheets

METHOD OF GROWING SEMICONDUCTOR IN VAPOR PHASE

This application is a continuation of application Ser. No. 07/672,555, filed Mar. 20, 1991, now abandoned.

FIELD OF THE INVENTION

The present invention relates to a method of and reactor for growing semiconductor in a vapor phase for use at manufacturing processes of semiconductor devices. More particularly, the invention relates to a method of and reactor for growing semiconductor suitable for use in growing Si (Si epitaxial layer) on the surface of a semiconductor substrate wafer.

BACKGROUND OF THE INVENTION

Various types of Si epitaxial layer growing reactors have been known in the art. Example of such reactors are shown in FIGS. 1 to 3. Reactors are broadly grouped into two types, one type being a batch type for batch processing more than 2 wafers, and the other type being a sequential type for processing single wafer one after another. Batch type reactors are grouped into a vertical type (high frequency heating) shown in FIG. 1 and a barrel type (radiation heating) shown in FIG. 2, depending upon the heating method and the structure of a reaction furnace. In the case of the batch type reactor shown in FIG. 1, a plurality of semiconductor substrate wafers 4, 4, ... are placed on a disk susceptor 2. In the case of the batch type reactor shown in FIG. 2, a plurality of wafers 4, 4, ... are mounted on the surface of a polygon susceptor 6. An example of the reactor processing single wafer per batch is shown in FIG. 3. In the case of this reactor, a wafer 4 is placed on a disk susceptor 10 housed within a reaction vessel 8 made of a rectangular quartz tube, and radiation-heated from the top and bottom sides by halogen lamps (not shown) mounted above and below the vessel 8.

With the batch type vapor phase growing reactors shown in FIGS. 1 and 2, wafers 4 are placed on the surface of the susceptor 2, 6 side by side. As the diameter of the wafer 4 becomes large, the number of wafers which can be processed at a time greatly decreases. For example, a barrel type reactor available in markets can process at most eighteen wafers of 5 inch diameter at a time, whereas it can process fifteen wafers of 6 inch diameter, or eight wafers of 8 inch diameter. Thus, the larger the wafer diameter, the more the production performance lowers and the vapor phase grow cost increases. That is, it takes about 100 minutes to perform one cycle of epitaxial growth by conventional batch type reactor, independent of wafer diameter.

The reactor shown in FIG. 3 can shorten the vapor phase growth sequence time by one tenth the conventional time or more, although it processes one wafer at a time. The reactor can therefore improve the production performance of wafers of larger diameter. The reactor, however, uses a reaction furnace of rectangular shape. It therefore becomes necessary to set the flow rate of carrier gas (hydrogen gas) equal to or faster than a flow rate of 100 l/min or slower, which is generally the same rate as that of a conventional batch type reactor. The gas quantity per One wafer increases accordingly, so it becomes difficult to reduce the vapor phase growth cost.

SUMMARY OF THE INVENTION

The present invention has been made to solve the above problem. It is therefore an object of the present invention to provide a method of and reactor for growing semiconductor in a vapor phase capable of preventing the productivity from being lowered even if wafers have a large diameter, and suppressing the rise of vapor phase growth cost.

According to one aspect of the present invention, there is provided a method of growing semiconductor in a vapor phase, comprising the steps of:
removing a silicon oxide film on the surface of a semiconductor substrate wafer; and
growing a silicon layer on the surface of the semiconductor substrate wafer in a vapor phase while rapidly rotating the wafer about a shaft substantially vertical to the wafer.

According to another aspect of this invention, there is provided an reactor for growing semiconductor comprising:
a first chamber for removing an oxide film on the surface of a semiconductor substrate wafer; and
a second chamber different from the first chamber for growing a silicon layer on the surface of the wafer with the oxide film removed, the second chamber being provided with driving means for rapidly rotating the wafer, pressure-reducing means for reducing a pressure of the second chamber, and heating means for heating the wafer.

DESCRIPTION OF THE PREFERRED EMBODIMENTS

Figure 1:
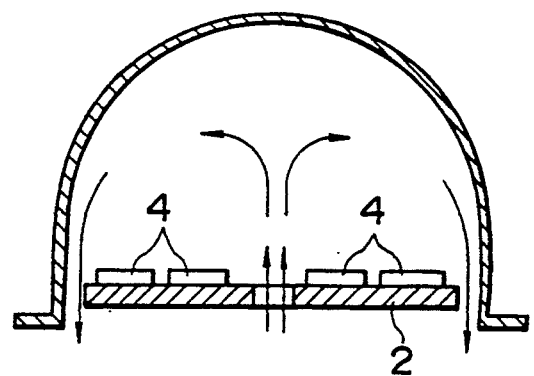
FIGS. 1 to 3 are cross sectional views of conventional reactors.
Figure 2:
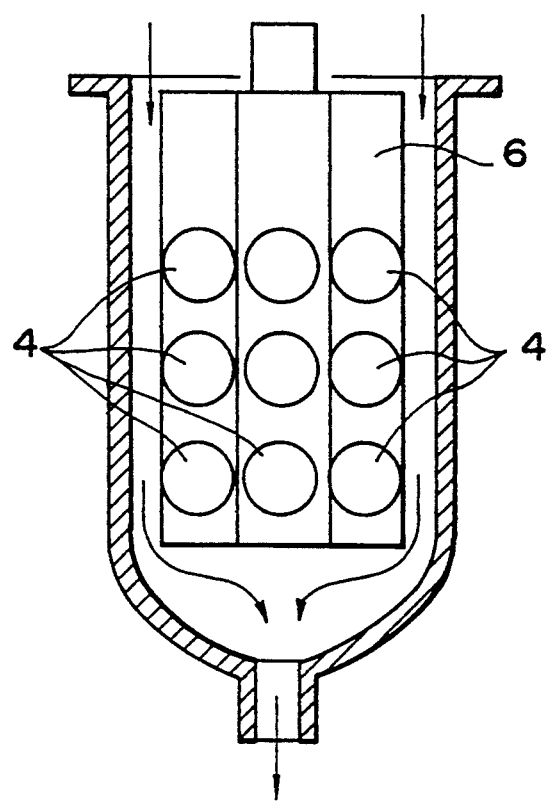
Figure 3:
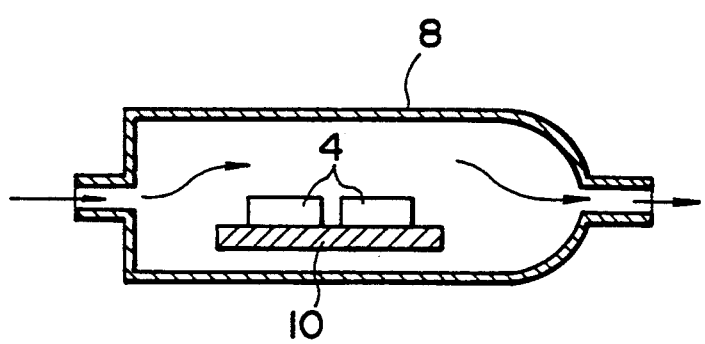
Figure 4:
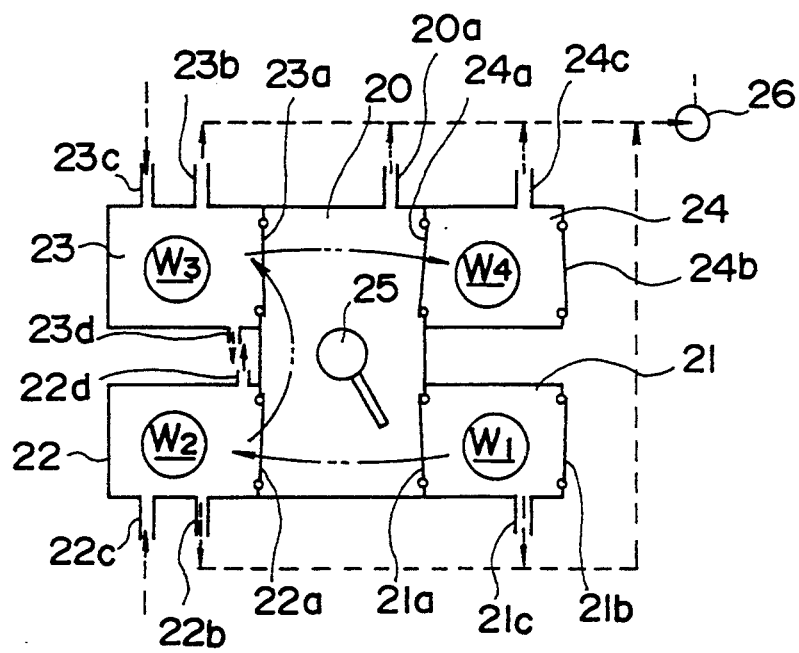
FIG. 4 is a plan view of an embodiment of the vapor phase growing reactor according to the present invention.

FIG. 4 is a schematic plan view showing an embodiment of the reactor of this invention. As seen from FIG. 4, the reactor has an unprocessed wafer storing first box 21, a pre-processing furnace 22, a deposition furnace 23, and a processed wafer storing second box 24, as well as a load lock chamber 20 maintained in a vacuum state. The load lock chamber 20 can be communicated with or sealed from each of the boxes 21 and 24 and furnaces 22 and 23. The first box 21 is used for storing an unprocessed wafer W1 before the vapor phase growth (epitaxial growth). The pre-processing furnace 22 is used for removing a native oxide film on the surface of a wafer W2. The deposition furnace 23 is used for growing an epitaxial layer on the surface of a wafer W3. The second box 24 is used for storing a processed wafer W4 formed with a grown epitaxial layer. The load lock chamber 20 is always maintained in a vacuum state or in an inactive gas atmosphere. A movable handling robot 25 is mounted within the load lock chamber 20. This robot 25 transfers a wafer to and from each chamber 21 to 24. Air-tight doors 21a to 24a are provided between the load lock chamber 20 and the four chambers 21 to 24. The load lock chamber 20 can be communicated with or sealed from each of the four chambers 21 to 24 by opening or closing the corresponding one of the four doors 21a to 24a. The unprocessed wafer storing first box 21 has an air-tight door 21b for receiving an unprocessed wafer from the outside, whereas the processed wafer storing second box 24 has an air-tight door 24b for delivering a processed wafer to the outside. Suction ports 20a, 21c, 22b, 23b, and 24c provided at the load lock chamber 20 and four chambers 21 to 24 are connected to a vacuum pump 26 via flow changeover valves and the like (not shown). The pre-processing furnace 22 and deposition furnace 23 are provided with gas inlet ports 22c and 23c and gas outlet ports 22d and 23d, respectively, for introducing or exhausting a desired type of gas.

Vapor phase epitaxial layer growth is realized using the reactor constructed as above in the following manner.

The load lock chamber 20 is set to a vacuum state after closing the doors 21a to 24a. The door 21b is opened, and an unprocessed wafer W1 is introduced from the outside into the first box 21. After the door 21b is closed, the first box 21 is set to a vacuum state. Thereafter, the door 21a is opened and the handling robot 25 is caused to move the wafer W1 to the pre-processing chamber 22 already in the vacuum state.

The wafer W2 in the pre-processing furnace 22 is placed on a disk susceptor (made of, e.g., a carbon base material with SiC coated over it). Hydrogen, or hydrogen and HF, or hydrogen and HCl are introduced into the furnace 22 via the inlet port 22c. The wafer W2 is then heated up to about 1050° C. in a hydrogen atmosphere by means of radiation heating, and maintained in this condition for one or two minutes. The native oxide film on the surface of the wafer W2 is thereby removed through hydrogen reduction. The above-described radiation heating is performed by halogen lamps (indicated at 48 in FIG. 6), or resistive heaters, or the like mounted outside of the pre-processing furnace 22 made of quartz.

Thereafter, heating by the halogen lamps or the like is stopped to lower the temperature of the wafer W2, and the handling robot 25 is caused to move the wafer W2 via the door 23a into the deposition furnace 23 previously scavenged.

Figure 5:
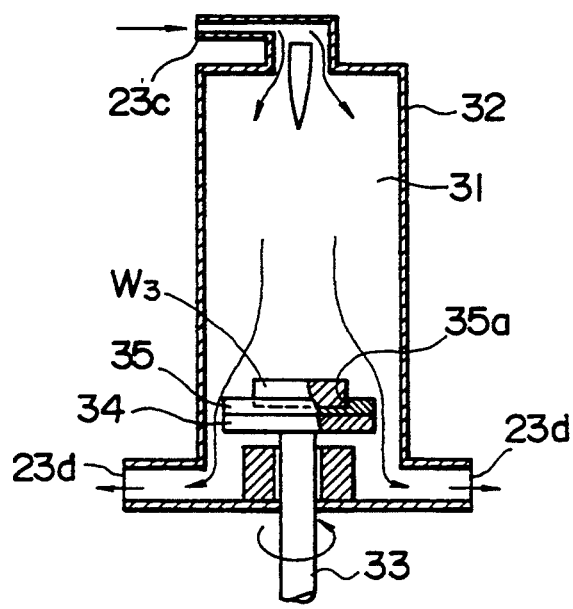
FIG. 5 is a .vertical cross sectional view of the deposition furnace shown in FIG. 4.

The details of the deposition furnace 23 are shown schematically in FIG. 5. A vessel 32 constituting a deposition chamber 31 is formed with an-inlet port 23c at the top portion and with outlet ports 23d at the bottom portion. Within this chamber 31, there is rotatably mounted a shaft 33 to which a susceptor 35 is fixedly connected. The wafer W3 is placed on the susceptor 35 and held in position within a wafer mounting recess 35a formed in the surface of the susceptor 35. The susceptor 35 is heated by a resistive heater (e.g., carbon heater) 34 mounted immediately below the susceptor 35. The carbon heater 34 is used because of its high thermal conductivity. The wafer W3 is then heated up to about 1000° C., through resistor heating by the resistor heater 34. Thereafter, reaction gas together with carrier gas $H_2$ (10 l/min or slower) is introduced within the chamber 31. The reaction gas may be any one of $SiH_2Cl_2$ (dichlorosilane), $SiHCl_3$ (trichlorosilane), and $SiH_4$ (monosilane). At this time, the wafer W3 is subjected to high speed rotation in the order of 1000 to 3000 rpm. This high speed rotation provides a thin uniform thickness of a gas stagnant layer on the surface of the wafer W3. In order to prevent turbulence generation within the deposition furnace 23, the pressure is reduced to equal or lower than 100 Torr in advance as shortly stated before. After a lapse of a period required for growing an epitaxial layer of a predetermined thickness in the vapor phase, the reaction gas flow is intercepted, and the carbon heater 34 is turned off to lower the temperature of the wafer W3. After the chamber 31 is set to a vacuum state, the robot is caused to pick up the processed wafer W3 via the opened door 23a and move it to the second box 24 in the vacuum state via the opened door 24a. In the above manner, a series of vapor phase growing processes for one wafer is completed. Such processes are sequentially repeated for other wafers for the vapor phase growth thereof. A certain number of processed wafers W4 are moved to the outside via the opened door 24b, while closing the door 24a.

With the above-described vapor phase growth, a maximum vapor phase growth rate of 10 m/min can be obtained. Therefore, while considering the time required for lowering and raising the temperature of a wafer, it takes about less than 10 minutes to execute a series of processes for an epitaxial layer having a thickness of 10 μm for example.

Figure 6:
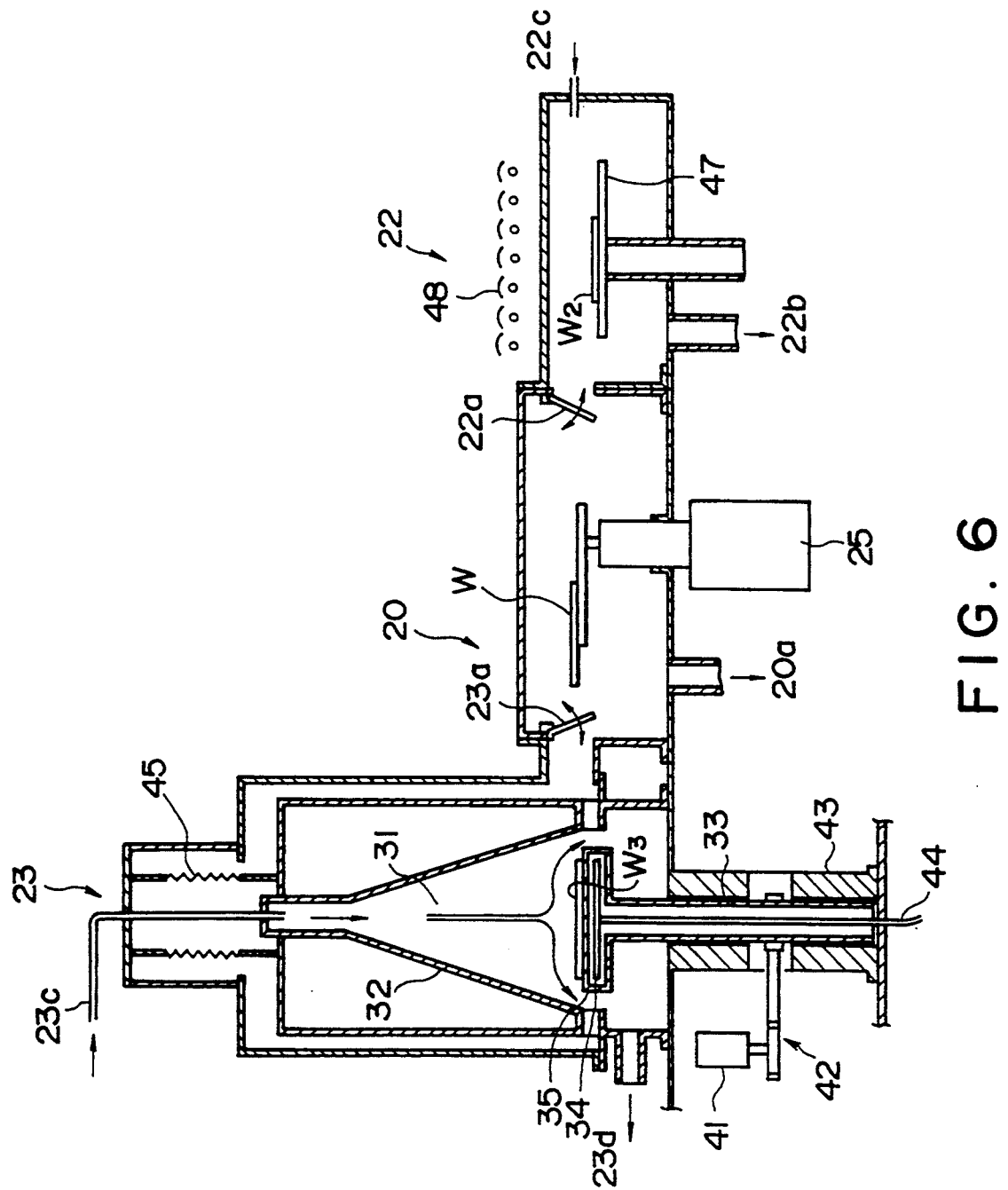
FIG. 6 is a cross sectional view showing a particular example of the reactor shown in FIG. 4.

FIG. 6 shows a particular example of the structure of the reactor shown in FIG. 4. In FIG. 6, like elements to those shown in FIGS. 4 and 5 are represented by using identical reference numerals and symbols.

In FIG. 6, the shaft 33 is supported by a bearing 43, and rotated by a motor 41 via a gear train 42. The shaft 33 has a hollow central portion. Lead wires 44 for passing heating current are guided within this hollow portion to be connected to the heater 34 mounted within a hollow portion of the susceptor 35. The handling robot 25 picks up the wafer W2 on the susceptor 47 within the pre-processing chamber 22, and conveys it onto the susceptor 35 within the vapor phase chamber 23.

According to the embodiment of this invention, the following advantageous effects can be obtained.

The wafer W3 within the-deposition chamber 23 is rotated at high speed. Therefore, a high precision equal to or lower than $+/-2\%$ of the layer thickness uniformity can be achieved at a low carrier flow rate of 10 l/min. This flow rate is equal to or lower than about one tenth a conventional flow rate.

Furthermore, a vapor phase growth speed of 10 m/min can be obtained which is equal to or faster than a two-fold conventional by available maximum speed. Accordingly, less than 10 minutes per one wafer is possible as the growth cycle time per one wafer. Thus, the vapor phase wafer growth ability per one deposition furnace becomes more than 6 wafers per hour. If three deposition furnaces are used, it becomes 18 wafers per hour, which is an ability two times or more as great as a conventional batch type deposition furnace for 6 inch or 8 inch wafers.

Still further, since a native oxide film is removed at the pre-processing furnace, a low deposition temperature about 1000° C. or lower can be used, so that there is almost no generation of slip or dislocation otherwise caused by thermal stress, irrespective of the speed of lowering and raising the temperature of a wafer. Thus, a vapor phase growing process can be performed in a short time. The productivity for a large wafer having a diameter of, e.g., 8 inches or larger can be improved considerably, with reduced gas flow and power consumption and with greatly reduced epitaxial layer growth cost.

In the above embodiment, a high temperature $H_2$ reduction method has been used for removing a native oxide film on the surface of a wafer. Instead of this method, an ion sputtering method or an HF vapor phase etching method may also be used.

What is claimed is:

1. A method of vapor phase epitaxial growth, comprising the steps of:
   removing a silicon oxide film on a surface of a semiconductor substrate wafer; and
   growing a silicon layer on the surface of said semiconductor substrate wafer by blowing a reaction gas and a carrier gas towards the surface of said wafer along a shaft substantially vertical to said wafer while rotating said wafer about said shaft at a rotational speed of 1,000 to 3,000 rpm and at a reduced pressure of about 100 Torr.

2. A method according to claim 1, wherein said vapor phase epitaxial growth is performed by heating said wafer up to about 1000° C.

3. A method according to claim 2, wherein said vapor phase epitaxial growth is performed by using $SiH_2Cl_2$ as a reaction gas and by flowing a carrier gas at a flow rate equal to or slower than 10 l/min.

4. A method according to claim 2, wherein said vapor phase epitaxial growth is performed by using $SiHCl_3$ as a reaction gas and by flowing a carrier gas at a flow rate equal to or slower than 10 l/min.

5. A method according to claim 2, wherein said vapor phase epitaxial growth is performed by using $SiH_4$ as a reaction gas and by flowing a carrier gas at a flow rate equal to or slower than 10 l/min.

6. A method according to claim 3, wherein said step of removing said silicon oxide film is carried out by an $H_2$ reduction method.

7. A method according to claim 4, wherein said step of removing said silicon oxide film is carried out by an $H_2$ reduction method.

8. A method according to claim 5, wherein said step of removing said silicon oxide film is carried out by an $H_2$ reduction method.

9. A method according to claim 3, wherein said step of removing said silicon oxide film is carried out by an ion sputtering method.

10. A method according to claim 4, wherein said step of removing said silicon oxide film is carried out by an ion sputtering method.

11. A method according to claim 5, wherein said step of removing said silicon oxide film is carried out by an ion sputtering method.

12. A method according to claim 3, wherein said step of removing said silicon oxide film is carried out by an HF vapor phase etching method.

13. A method according to claim 4, wherein said step of removing said silicon oxide film is carried out by an HF vapor phase etching method.

14. A method according to claim 5, wherein said step of removing said silicon oxide film is carried out by an HF vapor phase etching method.

15. A method according to claim 1, wherein said vapor phase epitaxial growth is performed using $SiH_2Cl_2$ as said reaction gas and by flowing said carrier gas at a flow rate of 10 l/min or less.

16. A method according to claim 1, wherein said vapor phase epitaxial growth is performed using $SiHCl_3$ as said reaction gas and by flowing said carrier gas at a flow rate of 10 l/min or less.

17. A method according to claim 1, wherein said vapor phase epitaxial growth is performed using $SiH_4$ as said reaction gas and by flowing said carrier gas at a flow rate of 10 l/min or less.

* * * * *